(12) United States Patent
Grillo et al.

(10) Patent No.: US 8,552,398 B2
(45) Date of Patent: Oct. 8, 2013

(54) CONVERTER OF ORBITAL MOMENTUM INTO SPIN MOMENTUM FOR THE POLARIZATION OF PARTICLE BEAMS

(71) Applicant: Consiglio Nazionale Delle Ricerche, Rome (IT)

(72) Inventors: Vincenzo Grillo, Modena (IT); Lorenzo Marrucci, Naples (IT); Ebrahim Karimi, Ottawa (CA); Enrico Santamato, Naples (IT)

(73) Assignee: Consiglio Nazionale Delle Ricerche, Rome (IT)

( * ) Notice: Subject to any disclaimer, the term of this patent is extended or adjusted under 35 U.S.C. 154(b) by 0 days.

(21) Appl. No.: 13/715,662

(22) Filed: Dec. 14, 2012

(65) Prior Publication Data
US 2013/0168577 A1    Jul. 4, 2013

(30) Foreign Application Priority Data

Dec. 16, 2011    (IT) .............................. TO2011A1161

(51) Int. Cl.
*H01J 37/26*    (2006.01)

(52) U.S. Cl.
CPC ..................................... *H01J 37/26* (2013.01)
USPC .................................................. 250/396 ML

(58) Field of Classification Search
USPC .................................................. 250/396 ML
See application file for complete search history.

(56) References Cited

U.S. PATENT DOCUMENTS 3,214,683 A * 10/1965 Andres .......................... 324/304
5,523,572 A    6/1996 Nakanishi et al.

2008/0210868 A1    9/2008 Kohashi et al.

OTHER PUBLICATIONS

Darrigol, O. "A History of the Question: Can Free Electrons be Polarized", Historical Studies in the Physical Sciences, 15(1): 39-79, 1984.
Chao, Y. et al. "CEBAF Accelerator Achievements", Journal of Physics: Conference Series, 299: 1-18, 2011.
Yamamoto, N. et al. "Status of the high brightness polarized electron source using transmission photocathode", Journal of Physics: Conference Series, 298: 1-6, 2011.
McGregor, S. et al. "Transverse quantum Sterm-Gerlach magnets for electrons", New Journal of Physics, 13: 1-17, 2011.
Bliokh, K. et al. "Semiclassical Dynamics of Electron Wave Packet States with Phase Vortices", Physical Review Letters, 99: 190404-1-190404-4, 2007.
Rose, H. et al. "Aberration Correction in Electron Microscopy", Proceedings of 2005 Particle Accelerator Conference, Knoxville, Tennessee, pp. 44-48, 2005.

(Continued)

*Primary Examiner* — Kiet T Nguyen
(74) *Attorney, Agent, or Firm* — Merchant & Gould P.C.

(57) ABSTRACT

An apparatus for spin polarizing a particle beam is adapted to process an input particle beam in such a way as to generate an at least partially spin polarized output particle beam. A vortex beam generator for imparting orbital angular momentum to the input particle beam. An electromagnetic field generator generates a transverse magnetic field, space-variant and symmetric with respect to the axis of the input particle beam, in such a way as to change the spin of the particles and attach thereto different values of orbital angular momentum in dependence on their input spin values. A beam component separating group spatially separates the particles in dependence on their orbital angular momentum values, in such a way as to obtain the at least partially spin polarized output particle beam.

12 Claims, 5 Drawing Sheets

(56) References Cited

OTHER PUBLICATIONS

Zach, J. et al. "Aberration correction in a low voltage SEM by a multipole corrector", Nuclear Instruments & Methods in Physics Research, Section A, 363:316-325, 1995.

Scheinfein, M. "Second order transfer matrices for inhomogeneous field Wien filters including spin-precession", Optik, 82(3): 99-113, 1989.

McMorran, B. et al. "Electron Vortex Beams with High Quanta of Orbital Angular Momentum", Science, 331: 192-195, 2011.

Italian Search Report for corresponding Italian Patent Application No. TO2011A001161 mailed Sep. 14, 2012.

Uchida, M. et al. "Generation of electron beams carrying orbital angular momentum" Nature, vol. 464, No. 7280, Apr. 1, 2010, pp. 737-739.

Verbeeck, J. et al. "Production and application of electron vortex beams", Nature, vol. 467, No. 7313, Sep. 16, 2010, pp. 301-304.

Verbeeck, J. et al. "A new way of producing electron vortex probes for STEM", Ultramicroscopy, vol. 113, Feb. 1, 2012, pp. 83-87.

Verbeeck, J. "Atomic scale electron vortices for nanoresearch", Applied Physics Letters, vol. 99, No. 20, Jan. 1, 2011, pp. 203109.

McMorran, B. et al. "Electron Laguerre-Gaussian beams", Lasers and Electro-Optics (CLEO), Laser Science and Photonic Applications—CLEO:2011—Laser Science to Photonic Applications, May 1-6, 2011, Baltimore, MD, pp. 1-2.

Wang, Y. et al. "Bessel-Gaussian electron beams of cylindrically symmetric spin polarization: Electron beams of cylindrically symmetric spin polarization", Europhysics Letters: A Letters Journal Exploring the Frontiers of Physics, Institute of Physics Publishing, Bristol, France, vol. 95, No. 4, Jul. 26, 2011, pp. 44001.

* cited by examiner

CONVERTER OF ORBITAL MOMENTUM INTO SPIN MOMENTUM FOR THE POLARIZATION OF PARTICLE BEAMS

This application claims benefit of Serial No. TO2011A001161, filed 16 Dec. 2011 in Italy and which application is incorporated herein by reference. To the extent appropriate, a claim of priority is made to each of the above disclosed applications.

BACKGROUND OF THE INVENTION

The present invention relates to an apparatus for spin polarizing a particle beam, adapted to process an input particle beam in such a way as to generate an at least partially spin polarized output particle beam.

It is known that the generation of spin polarized electron beams is at present very difficult and ineffective in terms of brightness and stability, and is therefore difficult to use in practical applications.

The polarization of electrons has been considered for many years to be an impossible task, mainly owing to the failure of methods based on classical mechanics, such as the Stern-Gerlach experiment for ions [1]. The first methods for producing weakly polarized beams consisted in the use of the asymmetries induced by the spin-orbit coupling in the Mott scattering on a gold foil [1].

At present, a high polarization is obtained mainly with semiconductor photocathodes, mainly multilayer GaAsP/GaAs structures under stress which are grown on GaP [2]. The mechanical stress in the semiconductor produces splitting in the valence bands, which promotes electron transitions with a well-defined polarization. The light from a laser is diffused on the photocathode to produce a localized emission of polarized electrons, which are thus accelerated to the working conditions.

The known polarized sources may achieve a brightness of $10^7$ A cm$^{-2}$ sr$^{-1}$ and a polarization purity of up to 90% [3]. Whereas for some applications these values may be sufficient, it should be noted that the effective dimensions of the source are of the order of several hundred nanometers, and that the lifetime under DC operation may reach at most 36 hours [3].

An article has recently proposed a method for the spin polarization of an electron beam in which the diffraction of the electrons is utilized [4]. However, this publication proposes fields and/or lateral dimensions for the apparatus which do not appear to be obtainable under normal laboratory conditions.

SUMMARY OF THE INVENTION

It is an object of the invention, therefore, to overcome the disadvantages of the known spin polarization techniques, making it possible in theory to produce polarized beams having high brightness and stability.

In view of this object, the invention relates to a spin polarization apparatus of the type defined in the introduction, comprising
  vortex beam generating means for imparting orbital angular momentum to said input particle beam;
  electromagnetic field generating means for generating a transverse magnetic field in a space region extending along a segment of the z axis of the input particle beam, in said space region the transverse magnetic field being homogeneous along the direction of the z axis and space-variant in radial and/or azimuthal direction, in such a way as to change the spin of the particles and attach thereto a plurality of different values of orbital angular momentum in dependence on their input spin values; and
  beam component separating means for spatially separating the particles in dependence on their orbital angular momentum values, in such a way as to obtain said at least partially spin polarized output particle beam.

The invention further relates to an apparatus for spin polarizing a particle beam, adapted to process an input particle beam in such a way as to generate an at least partially spin polarized output particle beam, comprising
  electromagnetic field generating means for generating a transverse magnetic field in a space region extending along a segment of the z axis of the input particle beam, in said space region the transverse magnetic field being homogeneous along the direction of the z axis and space-variant in radial and/or azimuthal direction, in such a way as to change the spin of the particles and attach thereto a plurality of different values of orbital angular momentum in dependence on their input spin values;
  a holographic mask for diffractively separating the particle beam into a central beam and a pair of satellite beams, and
  separating means for collecting at least one of the satellite beams and removing a peripheral portion therefrom, in such a way as to obtain the at least partially spin polarized output particle beam.

The invention additionally relates to a method for spin polarizing a particle beam, comprising the following steps:
  providing an input particle beam;
  imparting an orbital angular momentum to said input particle beam;
  in a space region extending along a segment of the z axis of the input particle beam, subjecting said input particle beam to a transverse magnetic field homogeneous along the direction of the z axis and space-variant in radial and/or azimuthal direction, in such a way as to change the spin of the particles and attach thereto a plurality of different values of orbital angular momentum in dependence on their input spin values; and
  spatially separating the particles in dependence on their orbital angular momentum values, in such a way as to obtain an at least partially spin polarized output particle beam.

The invention also relates to a method for spin polarizing a particle beam, comprising the following steps:
  providing an input particle beam;
  in a space region extending along a segment of the z axis of the input particle beam, subjecting said input particle beam to a transverse magnetic field homogeneous along the direction of the z axis and space-variant in radial and/or azimuthal direction, in such a way as to change the spin of the particles and attach thereto a plurality of different values of orbital angular momentum in dependence on their input spin values;
  diffractively separating the particle beam into a central beam and a pair of satellite beams, and
  collecting at least one of the satellite beams and removing a peripheral portion therefrom, in such a way as to obtain the at least partially spin polarized output particle beam.

The invention moreover relates to a method for producing a vortex particle beam, characterized in that it comprises the following steps:
  providing a spin polarized input particle beam; and
  in a space region extending along a segment of the z axis of the input particle beam, subjecting said input particle beam to a transverse magnetic field homogeneous along the direction of the z axis and space-variant in radial and/or azimuthal direction, in such a way as to impart to said particle beam an orbital angular momentum in dependence on the particle spin.

The present invention provides an apparatus and a method for filtering a particle beam, in particular an electron beam, on the basis of the spin thereof, that is "spin polarizing" the beam by means of non-standard elements of electron optics. This filter may be used to create spin polarized particle beams of high brightness with respect to the known techniques. The polarization mechanism is based on principles of quantum mechanics and consists in the conversion of the orbital angular momentum into the intrinsic spin polarization. For this purpose, a transverse magnetic field homogeneous in the axial direction but space-variant in the radial direction induces a spin inversion and converts the corresponding change in angular spin momentum into an orbital angular momentum (OAM) of said beam, utilizing a difference in geometric phase which originates in the manipulation of the spin.

If applied to a spatially coherent, spin polarized input particle beam, the invention makes it possible to generate a vortex particle beam, which brings an orbital angular momentum. If applied to a non-polarized input beam, the invention makes it possible to realize an efficient spin polarization filter.

The description which follows refers, for simplicity, to the case in which the invention is applied to electron beams. However, it can be extended to beams of other types of particles, provided that they are provided with magnetic spin momentum, such as neutrons, atoms, ions, etc. In the case of electron beams, the invention can easily be integrated in the components of electron microscopes.

BRIEF DESCRIPTION OF THE DRAWINGS

Further features and advantages of the apparatus and of the method according to the invention will become evident from the detailed description which follows and which is given with reference to the accompanying drawings, which are provided purely by way of non-limiting example and in which:

FIGS. 2a-c show respectively: (a) the distribution in the plane xy of the vector potential $A_z$ calculated for a quadrupole Wien filter; (b) a three-dimensional representation of the quadrupole Wien filter; and (c) a representation on an enlarged scale of the central part of the distribution shown in FIG. 2a;

FIGS. 4a-c show respectively: (a-b) the transverse profiles of different components of the output electron beam in the far field; (c) a possible iris radius used to separate the different components of the electron beam in the apparatus shown in FIG. 3; (d) the intensity profiles of the components shown in FIGS. 4a and 4b;

DETAILED DESCRIPTION OF THE PREFERRED EMBODIMENTS

The invention proceeds from the recent introduction of new diffractive elements of electron optics which make it possible to generate what are known as vortex electron beams, that is electron beams which have a specific orbital angular momentum (OAM) value [5]. In a cylindrical coordinate system r, φ, z, with the z axis along the axis of the beam, a vortex electron beam is described by a wave function having the general form ψ(r, φ, z, t)=u(r, z, t)exp(ilφ), where l is a (non-zero) integer and u is cancelled out at r=0. As in the case of atomic orbitals, l is the eigenvalue of the z component of the orbital angular momentum (OAM) operator $\hat{L}_z = -i\partial_\phi$ (in units of the reduced Planck constant $\hbar$), and therefore an electron beam of this form carries $l\hbar$ of OAM per electron [6].

According to the present invention, a beam of electrons which travel in free space undergoes a "spin-to-orbital angular momentum conversion" (STOC) process in the presence of a space-variant magnetic field. Since the particle electrons are charged, the magnetic field, in addition to acting on the spin, also induces forces which have to be compensated for in order to avoid instances of strong distortion or deflection of the beam. This compensation may be obtained with a suitable electric field, and this led the inventors to conceiving the proposed apparatus as a space-variant Wien filter. This apparatus can be utilized to generate vortex electron beams when use is made of a spin polarized beam as input. Conversely, if a pure vortex beam is used as input, produced for example by a holographic method, it is possible to use the STOC process to filter a single spin polarized component of the input beam, as will be shown hereinbelow.

Consideration is given to an electron beam propagating in vacuum along the z axis and crossing a space region lying between z=0 and z=L in which said beam is subject to an electric field E=−∇Φ and to a magnetic field B=∇×A, where Φ and A are respectively the scalar potential and the vector potential. In non-relativistic approximation and neglecting all the effects of Coulomb self-interaction (small charge density limit), the quantum propagation of the electron beam and the evolution of the spin are generally described by Pauli's equation $$i\hbar \partial_t \tilde{\psi} = \left[ \frac{1}{2m}(-i\hbar\nabla - eA)^2 + e\Phi - B\cdot\hat{\mu} \right]\tilde{\psi} \quad (1)$$

where $\tilde{\psi}$ is the spinorial two-component wave function of the electron beam, e=−|e| and m are the charge and the mass of the electron, $\partial_t$ is the derivative with respect to the time of the time variable t, $$\hat{\mu} = -\frac{1}{2}g\mu_B \hat{\sigma}$$

is the magnetic momentum of the electron, with $\mu_B = \hbar|e|/2m$ being the Bohr magneton, g≅2 being the g factor of the electron, and $\hat{\rho}=(\hat{\rho}_x, \hat{\rho}_y, \hat{\rho}_z)$ being the Pauli matrix vector.

As a first step, consideration is given to the simplest case, in which the electric and magnetic fields are uniform, lying in the transverse plane xy, and are arranged as in standard Wien filters, that is perpendicularly in relation to one another and balanced so as to cancel out the average Lorentz force, that is $E_0 = B_0 p_c/m$, where $E_0$ and $B_0$ are the moduli of the electric and magnetic field and $p_c$ is the average beam momentum. The magnetic field B forms an arbitrary angle α with the x axis of the plane xy. In this case, the full Pauli equation is solved in the paraxial slow-varying-envelope approximation for an input beam having a Gaussian profile and an arbitrary uniform input spin state $|\psi\rangle_{in} = a_1|\uparrow\rangle + a_2|\downarrow\rangle$, where $|\uparrow\rangle$ and

|↓⟩ represent a state in which the spin is parallel or antiparallel to the z axis, respectively. The propagation behaviour of the beam corresponds to the well-known astigmatic lensing in the plane perpendicular to the magnetic field. More specifically, the beam undergoes periodic amplitude oscillations, with a space period $\Lambda_2=\pi R_c$, where $R_c=p_z/(|e|B_0)$ is the cyclotron radius. The output spin state is, however, given by the following general expression $$|\psi\rangle_{out}=a_1[\cos(\delta/2)|\uparrow\rangle+\sin(\delta/2)ie^{i\alpha}|\downarrow\rangle]+a_2[\cos(\delta/2)|\downarrow\rangle+\sin(\delta/2)ie^{-i\alpha}|\uparrow\rangle], \quad (2)$$

where $\delta=4\pi L/\Lambda_1$ and $\Lambda_1=8\pi R_c/g\cong 4\Lambda_2$. This spinorial evolution corresponds to the classical Larmor precession of the spin with the space period $\Lambda_1/2$, $\delta$ being the total angle of precession. However, in addition to the spin precession, equation (2) predicts the occurrence of phase variations of the wave function. In particular, for an input spin state $|\uparrow\rangle$ or $|\downarrow\rangle$ and a total spin precession exactly of half a turn, that is $\delta=\pi$ or $L=\Lambda_1/4$, the wave function is subjected to a phase variation given by $\pm\alpha+\pi/2$, where $\alpha$ is the angle of orientation of the magnetic field mentioned above and the sign $\pm$ is fixed by the input spin orientation (+ for $|\uparrow\rangle$ and − for $|\downarrow\rangle$). These phase variations may be interpreted as a particular case of geometric Berry phases produced by the manipulation of the spin.

Consideration is now given to the case of a space-variant magnetic field, in particular a multipolar transverse field geometry which is symmetrical with respect to the z axis of the beam, described by the following expression for the magnetic field (with the vector given in Cartesian components): $B(r, \phi, z)=B_0(r)(\cos\alpha(\phi), \sin\alpha(\phi), 0)$, where the angle $\alpha$ is now the following function of the azimuthal angle:

$$\alpha(r,\phi,z)=q\phi+\beta \quad (3)$$

where q is a non-zero integer and $\beta$ a constant. It is clear that such a field pattern has to have a singularity of topological charge q at r=0. In particular, by imposing the cancellation of the divergence of the field, it is found that the radial factor $B_0(r)\sim r^{-q}$, that is the field is cancelled out on the z axis for q<0, whereas it diverges for q>0. In the latter case, there has to be a field source on the axis. Hereinbelow, for simplicity "q filter" denotes a balanced Wien filter, the magnetic field distribution of which in the plane transverse to the beam obeys the equation (3). The electric field will assume an expression identical to that of the magnetic field, with the exception of a rotation of $\pi/2$, to balance the Lorentz force: $E(r, \phi, z)=E_0(r)(\sin\alpha(\phi),-\cos\alpha(\phi),0)$. Some examples of field distributions for the q filter are shown in FIGS. 1a-d.

Figure 1:
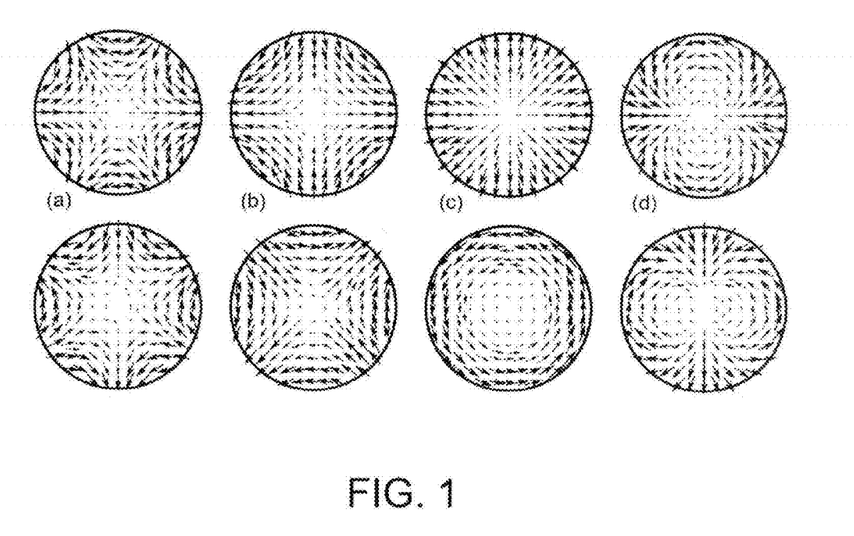
FIGS. 1a-d show the magnetic and electric field geometries associated with different topological charge values in a Wien filter of the polarization apparatus according to the invention.

FIG. 1a shows the pattern of the electric field (top image) and the pattern of the magnetic field (bottom image) for the topological charge q=−2; FIG. 1b the same patterns for q=−1; FIG. 1c instead for q=1; and FIG. 1d for q=2; in all cases $\beta=\pi/2$.

For the purposes of the present invention, preference is given to the negative q geometries, which do not require a field source at r=0. By way of example, the case where q=−1 corresponds to the standard quadrupole geometry of electron optics, whereas q=−2 corresponds to the hexapole geometry. Wien filters having these geometries have been developed in the past for correcting chromatic aberrations [7, 8]. Moreover, non-homogeneous Wien filters comprising a number of multipolar terms have also been taken into consideration in spin manipulation, with the additional advantage of obtaining a stigmatic lensing behaviour. [9].

Figure 2:
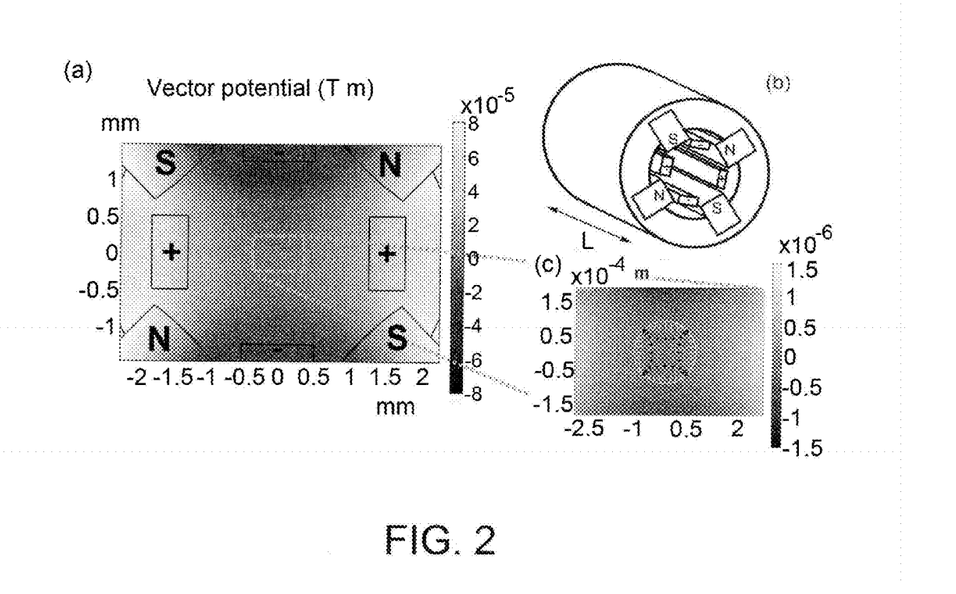

A possible design of the q filter where q=−1, and therefore with a quadrupole geometry, is shown in FIGS. 2a-c. In these figures, consideration is given to a filter having a length L of 100 cm (or better approximately 120 cm to take the relativistic effects into account). FIG. 2a shows the distribution of the calculated vector potential $A_z$, approximately proportional to the electric potential, and the projection on the xy plane of the electron trajectories simulated by an energy of 100 keV (more clearly visible in FIG. 2c), for an input beam of annular shape having a radius r=100 μm (the colour of the rays becomes darker as z increases). FIG. 2b is a three-dimensional schematic representation of the filter; this has in essence an annular structure which surrounds a space region of length L through which the particle beam is intended to cross, coaxially to the z axis. Arranged along the circumferential direction of the filter are positive and negative electrodes and the N and S poles for generating the desired fields. FIG. 2c shows a view on an enlarged scale of the central region of the filter. The magnetic field at r which is required to obtain the tuning condition $\delta=\pi$ is equal to 3.5 mT, with a corresponding electric field of 575 kV/m. These values are obtained with an electrode potential difference of approximately 9 kV and a magnetization of 135 A/mm. The fields have to be determined with a precision of 1 part in $10^4$ with respect to the planned values.

In non-uniform field geometry conditions, it is not possible to analytically solve the full Pauli equation. However, the propagation of the beam has already been described by classic dynamics and can be derived analytically, using a power series in r, or numerically by means of ray tracing. In the first case, it is found that to first order the filter for q≠0 is already stigmatic, that is it preserves the circular symmetry of the beam. Aberration effects are introduced solely by second order corrections. This behaviour has been confirmed by the inventors by means of numerical ray tracing simulations, which show relatively weak higher-order aberrations. It should be noted that these simulations were made with realistic values of the electric and magnetic fields, to obtain a spin precession of half a turn along a distance of 120 cm with a beam radius of 100 μm. It is expected that these calculations effectively reproduce the evolution of the electron density and of the spin precession which would be obtained from Pauli's equation. However, Pauli's equation predicts an additional, purely quantum effect, that is the geometric phase discussed above. In a semiclassical approximation, the geometric phase is still given by $\pm\alpha+\pi/2$, where $\alpha$ is now, however, dependent on the position and is given by equation (3). More precisely, neglecting the aberrations, each possible electron trajectory in a beam is rectilinear and parallel to the z axis. Therefore, the electrons which travel along a given trajectory meet a constant magnetic field of modulus $B_0(r)$ and orientation $\alpha(\phi)$. The set of all the electrons which travel at a determined radius r thus undergo a uniform spin precession through an angle $\delta(r)$ and, if $\delta(r)=\pi$ (i.e. for a spin rotation by half a turn), these also acquire a space-variant geometric phase given by $\pm\alpha(\phi)+\pi/2=\pm q\phi\pm\beta+\pi/2$, where the sign $\pm$ is determined by the input spin orientation. In other words, the outgoing wave function acquires a phase factor exp(il$\phi$), where l=±q, corresponding to a vortex beam where OAM+q$\hbar$. In a quantum mechanics notation, the spin polarized input electrons with a given initial OAM l passing through the q filter undergo the following transformations:

$$|\uparrow,l\rangle \rightarrow \cos(\delta/2)|\uparrow,l\rangle+ie^{i\beta}\sin(\beta/2)|\downarrow,l+q\rangle$$

$$|\downarrow,l\rangle \rightarrow \cos(\delta/2)|\downarrow,l\rangle+ie^{-i\beta}\sin(\delta/2)|\uparrow,l-q\rangle \quad (4)$$

where the ket indices here specify both the spin state (arrows) and the OAM eigenvalue.

Equations (4) show that, when passing through the q filter, a fraction $f=\sin^2(\delta/2)$ of the electrons in the beam invert the spin thereof and acquire an OAM $\pm q\hbar$, whereas the remaining fraction $1-f=\cos^2(\delta/2)$ pass through the aforementioned filter without any change. When $L=\Lambda_1/4$, $\delta=\pi$ and all the electrons undergo spin inversion and acquire the corresponding OAM. In the specific case where q=1, the variation in spin angular momentum for the electrons which undergo the spin inversion is exactly balanced by the OAM variation, in such a way that the total electron angular momentum remains unchanged when crossing through the filter. This case therefore corresponds to a process of complete spin-to-orbital angular momentum conversion, and it occurs for q=1 since this geometry is rotationally invariant and therefore there is no exchange of angular momentum with the field sources in the filter. In the case where q≠1, the input spin again controls the sign of the OAM variation, but the total angular momentum of the beam is not preserved and therefore there is an exchange of angular momentum with the field sources. It should be noted that this OAM variation can also be explained as the effect of the spin-related magnetic dipole force which acts on the electrons within the magnetic field gradients.

The tuning condition $L=\Lambda_1/4$ or $\delta=\pi$ can be obtained in principle for a given radius r by adjusting the intensity of the magnetic and electric fields or the length of the filter L. Since the precession angle $\delta$ is dependent on r, this tuning condition can be applied, however, to the entire beam only if the latter is shaped like a ring, that is with the density of the electrons concentrated at a given radius r. Vortex beams where OAM l≠0 typically have a doughnut shape, and as a result they can approximate a ring rather accurately. On the other hand, a Gaussian input beam (where l=0) cannot be transformed completely, since $\delta=0$ at r=0, where the Gaussian beam is at the maximum density. In these cases, only a fraction f of the electrons would be converted.

So far, it has been assumed that the input beam is spin polarized. However, spin polarized electron beams of high brightness (i.e. spatially coherent) which are suitable for high-resolution TEM applications are not readily available. As indicated above, known spin polarized sources can achieve a brightness of $10^7$ A cm$^{-2}$ sr$^{-1}$ and a polarization purity of up to 90% [3] (and the source decays over time owing to the damage induced by lasers). It is therefore of interest to analyse the effect of the space-variant q filter on an initially non-polarized electron beam having an arbitrary initial OAM l. This input beam may simply be viewed as a statistical mix in which 50% of the electrons are in the state $|\uparrow,l\rangle$ and the other 50% are in the state $|\uparrow,l\rangle$. After passing through the filter under the tuning conditions, the beam becomes a mix of states $|\downarrow,l+q\rangle$ and $|\uparrow,l-q\rangle$, for which spin and OAM are correlated (if the filter is not under the tuning conditions, the fraction of electrons converted decreases to f/2 in each spin-orbit state, and there will therefore be a residual fraction 1−f of electrons in the states $|\uparrow,l\rangle$ and $|\downarrow,l\rangle$)). This spin-OAM correlation can be utilized to realize an effective apparatus for spin polarizing an electron beam. In principle, this apparatus requires essentially four basic elements in sequence, that is:

(i) an OAM manipulation device to set l≠0;
(ii) a q filter where q=1 to generate a mix of electrons in the states $|\downarrow,2l\rangle$ and $|\uparrow,0\rangle$;
(iii) a free propagation (or imaging) stage which makes it possible for these two states to develop different radial profiles by means of diffraction on account of the different OAM values thereof;
(iv) a circular aperture for finally separating the two states.

Figure 3:
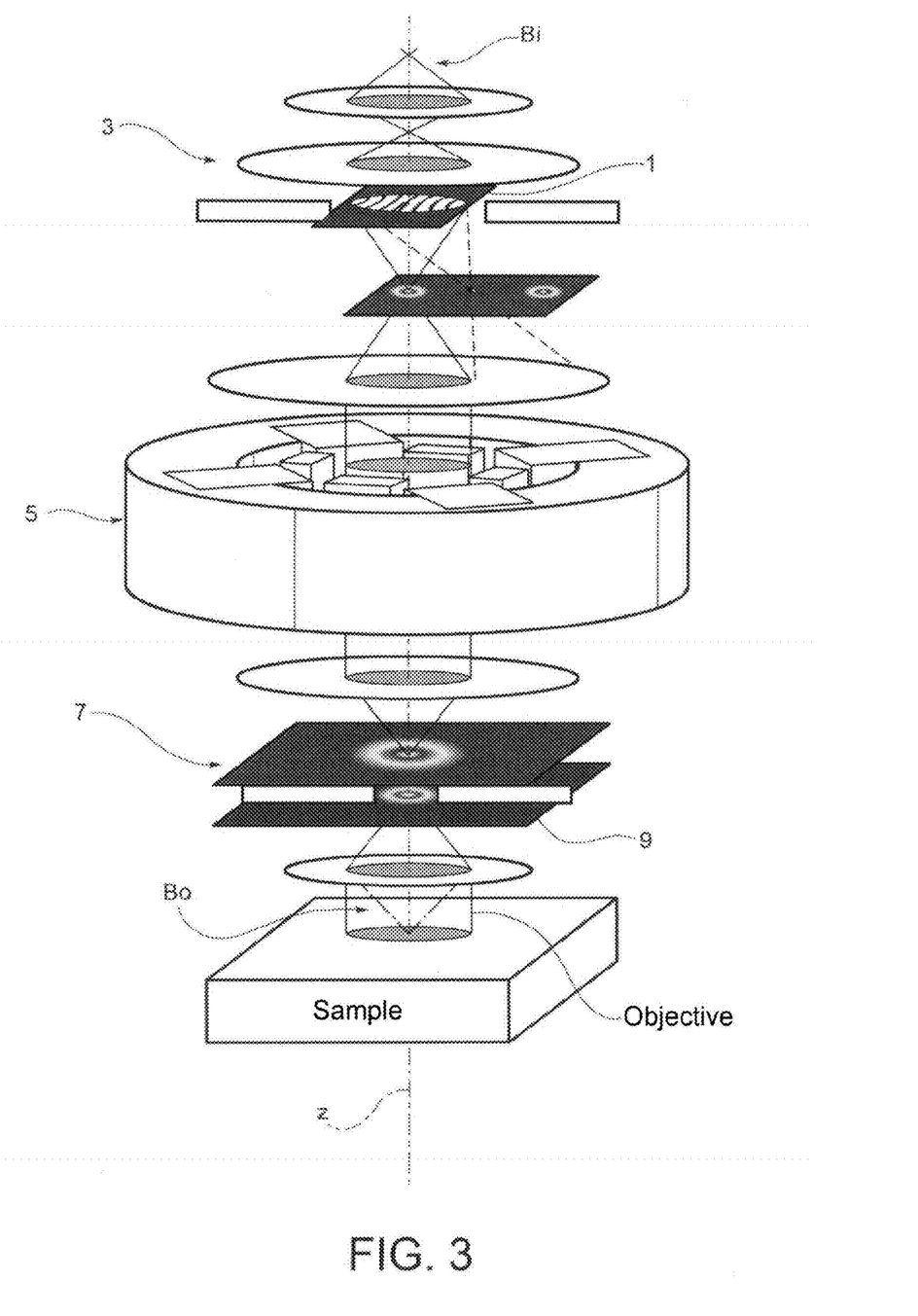
FIG. 3 shows an example of architecture of an electron microscope provided with a polarization apparatus according to the invention.

FIG. 3 schematically shows an example of architecture of a microscope which is equipped to realize the aforementioned functions. The reference numbers indicated hereinbelow are those used in this figure.

The microscope shown in FIG. 3 therefore comprises a vortex beam generator 1 for imparting orbital angular momentum to the input particle beam Bi (function (i)), which is arranged on the aperture of a first condenser 3. This generator 1 may be realized, for example, as a holographic mask, in particular with a fork-like [5, 10] or spiral-like [11] aperture.

Provision is also made of an electromagnetic field generator 5 arranged after the vortex beam generator 1. The electromagnetic field generator 5 is suitable for generating a transverse magnetic field (that is with a component along the zero z axis) in the space region extending along a segment of length L of the z axis; in said space region the transverse magnetic field is homogeneous along the direction of the z axis and space-variant in radial and/or azimuthal direction, in such a way as to change the spin of the particles and attach thereto a plurality of different values of orbital angular momentum in dependence on their input spin values (function (ii)). In the exemplary embodiment shown in FIG. 3, the electromagnetic field generator is suitable for additionally generating a transverse electric field so as to balance the Lorentz force produced by the magnetic field on the particles.

Provision is finally made of an apparatus 7, 9 for separating the components of the beam, said apparatus being suitable for spatially separating the particles in dependence on their orbital angular momentum values (functions (iii) and (iv)), in such a way as to obtain the at least partially spin polarized output particle beam Bo. This may be obtained by means of diffraction of the particles, through the aperture of a second condenser 7 arranged after the magnetic field generator 5, and subsequent filtering of the undesirable component(s) through a diaphragm 9 arranged after the second condenser 7.

Figure 4:
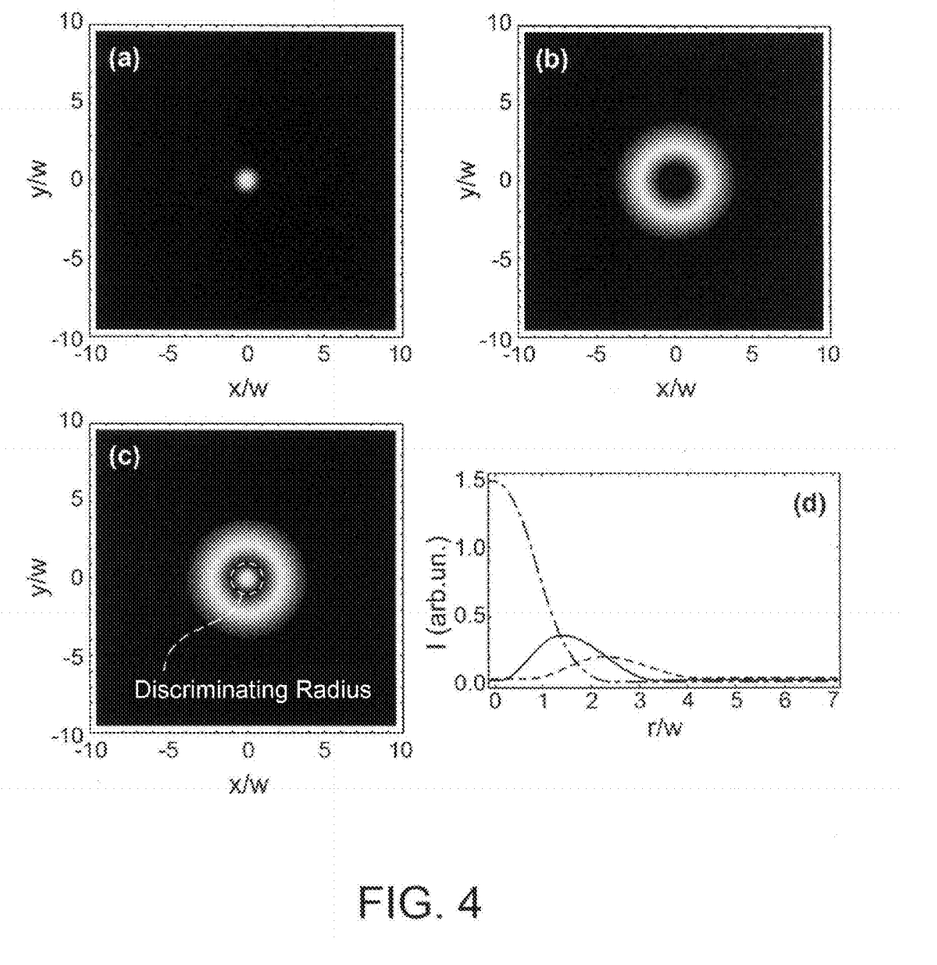

In particular, in stage (iii) the state $|\downarrow,2l\rangle$ acquires a radial doughnut distribution, as in Laguerre-Gaussian modes where OAM 2l, which is cancelled out close to the axis of the beam as $r^{2l}$, whereas the state $|\uparrow,0\rangle$ becomes approximately Gaussian, with a maximum intensity at the beam axis. FIGS. 4a, 4b show exactly the transverse profiles in the far field for the components l=0 (FIG. 4a) and l=2 (FIG. 4b). FIG. 4d shows the intensity profiles of the same components (l=0—dash-dotted line; l=2—dashed line) and of the possible residual component l=1 for a filter not under tuning conditions (solid line).

Applying a suitable iris (FIG. 4c) will select the desired component of the beam, for example the electrons in the completely polarized state $|\uparrow,0\rangle$. A specific calculation for the case of |q|=|l|=1 and an iris radius equal to the beam waist w in the far field gives rise to a transmission efficiency of the apparatus according to the invention of 55.5% (excluding the losses which arise owing to the OAM manipulation device) and a polarization level $(I_\uparrow - I_\downarrow)/(I_\uparrow + I_\downarrow)$, where $I_{\uparrow,\downarrow}$ are the two spin polarized currents, of approximately 97.5%. Greater levels of polarization may be obtained, at the expense of efficiency, by reducing the iris diameter or using higher q values (or vice versa).

It should be noted that the aforementioned apparatus also operates with a filter under partial tuning conditions, since in this case the non-modified component of the electron beam is left in the initial OAM state l=q, and is therefore removed from the iris. A filter in these conditions will have, however, a reduced efficiency of the factor $f=\sin^2(\delta/2)$.

The aberrations possibly introduced by the filter, if uncorrected, could influence its efficiency but not its principle of operation, in that the latter is based on the vortex effect, which is protected by the topological stability. Finally, the possible spin depolarization effect owing to the fringe fields may be neglected if the ratio between the filter length and gap dimension is large enough [9].

It is noted that the spin filtering technique described above constitutes a new counterexample of the old hypothesis of Bohr whereby the free electrons cannot be spin polarized by utilizing the magnetic fields, on account of quantum uncertainty effects [1]. The reason why the present invention makes it possible to overcome Bohr's arguments is essentially that use is not made directly of the magnetic forces to obtain the separation, but instead use is made of quantum diffraction, as was also recently proposed by McGregor et al. [4].

The apparatus described above can be realized in a relatively simple manner for applications in standard electron beam sources, such as those used in TEM or other types of electron microscopy.

Figure 5:
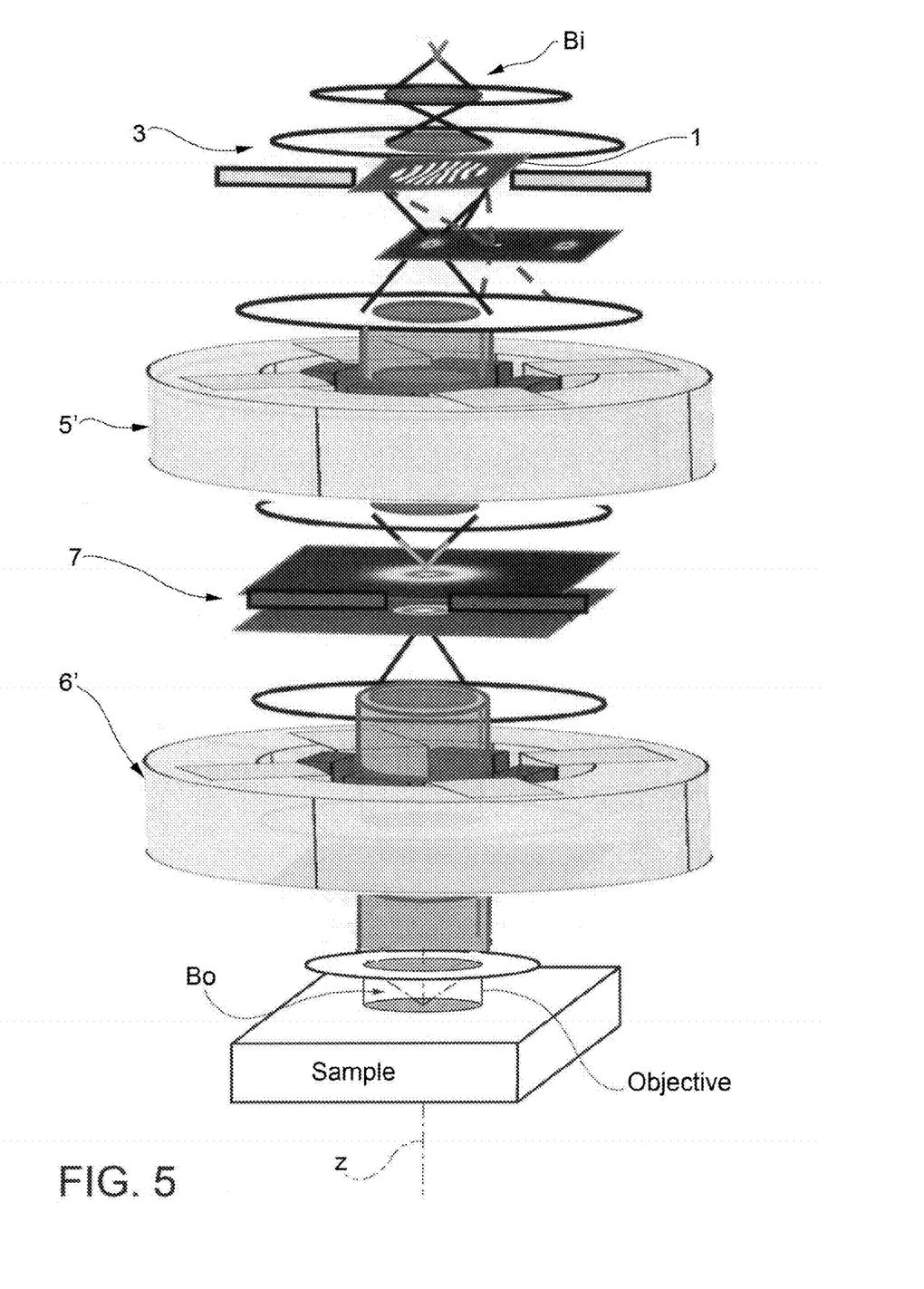
FIG. 5 shows a variant of the architecture of an electron microscope shown in FIG. 3.

FIG. 5 shows a variant of the architecture of the electron microscope shown in FIG. 3. In this figure, the elements corresponding to those in the example shown in FIG. 3 have been denoted by the same numerals, and will not be described further.

In essence, the architecture in FIG. 5 differs from the preceding architecture in that it does not have the balanced Wien filter.

Provided after the vortex beam generator 1 is an electromagnetic field generator, denoted by 5'. The electromagnetic field generator 5 is suitable for generating a transverse magnetic field (that is with a component along the zero z axis) in the space region extending along a segment of length L of the z axis; in said space region the transverse magnetic field is homogeneous along the direction of the z axis and space-variant in radial and/or azimuthal direction, in such a way as to change the spin of the particles and attach thereto a plurality of different values of orbital angular momentum in dependence on their input spin values (that is function (ii) indicated above). In contrast to the exemplary embodiment shown in FIG. 3, the electromagnetic field generator 5' is not suitable for generating a transverse electric field to balance the Lorentz force produced by the magnetic field on the particles. Without the balancing of the electric field, the magnetic field introduces undesirable astigmatic aberrations into the beam.

As a result, a second electromagnetic field generator 6' is present after the electromagnetic field generator 5', arranged coaxially to the first electromagnetic field generator 5' and having the same geometry (same number of poles) as the first electromagnetic field generator 5', but with an inverted pole arrangement. In a space region surrounded by the second electromagnetic field generator 6', what is generated is therefore a transverse magnetic field equal to but of opposing sign with respect to the transverse magnetic field generated by the electromagnetic field generating means 5'. Analogously to the embodiment shown in FIG. 3, the aperture of a second condenser 7 is placed after the first electromagnetic field generator 5'; in the architecture shown in FIG. 5, however, this aperture is arranged in such a way as to precede the second electromagnetic field generator 6'.

This variant could be advantageously implemented in a last-generation electron microscope, utilizing the lenses themselves of the electron microscope (with hexapoles for the correction of the aberrations) without adding new elements, on the one hand for producing a variation in the spin of the particles and on the other hand for correcting the astigmatic aberrations. With respect to the preceding embodiment, the disadvantage of the variant in question is that it introduces instability of the beam so as not to allow for strong fields and therefore strong polarizations.

According to calculations made by the inventors, the Wien filter used in the embodiment shown in FIG. 3 could give rise to temporal coherence problems; the non-monochromaticity of the current electron beams has the effect that a filter compensated ($|E|=V|B|$) for the principal energy of the beam is not compensated for various energies which are present within the energetic distribution of the source. With the current sources, it is possible to consider a maximum incident intensity conversion of 1-4%. This would also give rise to problems with the actual possibility of separating the polarized part from the rest, since the tail of the non-polarized electron distribution would obscure a large amount of the non-polarized intensity.

Whereas the main problem of temporal coherence appears to be linked to current limits of the sources, there may be some ways for reducing the overlapping between polarized and non-polarized states.

One way consists in increasing the topological charge of the multipole and of the beam; lenses where $|q|>2$ are possible, although they are more difficult to realize or in any case more rare.

Another way consists in removing the electric field; in this case there would be a lesser dependence on the temporal coherence (monochromaticity), but with possible problems relating to astigmatic aberrations discussed above.

Figure 6:
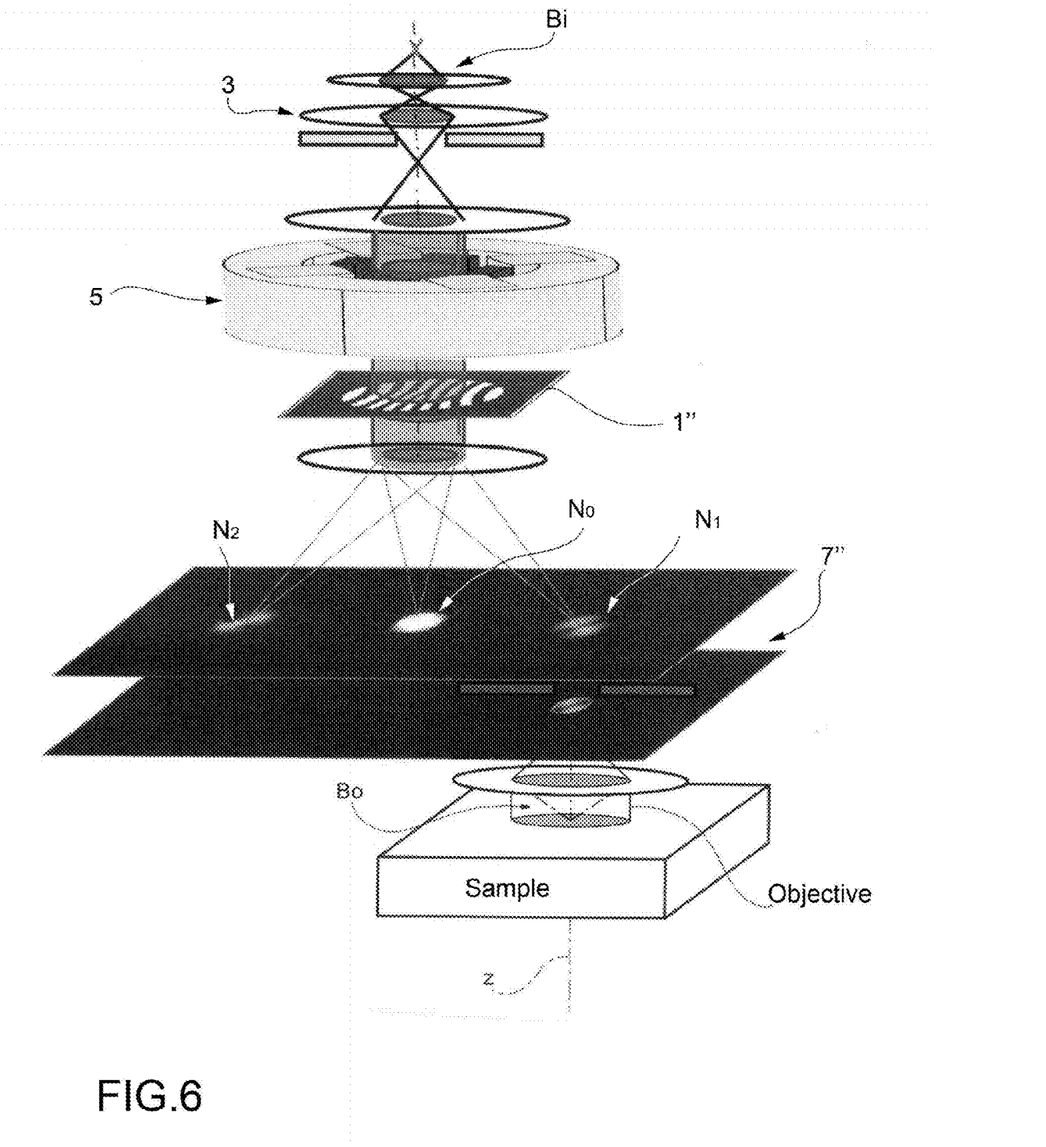
FIG. 6 shows a further variant of architecture of an electron microscope.

A further way consists in making the input beam pass through the multipole, and only then through the holographic mask. It can be shown that, in this configuration, the central part of the satellite beams is polarized (at least in the case of fields which are not too strong and/or lenses which are not too long). FIG. 6 schematically shows an example of architecture of a microscope realized according to this configuration variant. The same reference numerals have been used for elements corresponding to those shown in FIG. 3.

The microscope shown in FIG. 6 therefore comprises an electromagnetic field generator 5 arranged after the aperture of a first condenser 3. The electromagnetic field generator 5 is suitable for generating a transverse magnetic field (that is with a component along the zero z axis) in the space region extending along a segment of length L of the z axis; in said space region the transverse magnetic field is homogeneous along the direction of the z axis and space-variant in radial and/or azimuthal direction, in such a way as to change the spin of the particles and attach thereto a plurality of different values of orbital angular momentum in dependence on their input spin values (function (ii)). In the exemplary embodiment shown in FIG. 6, it may be provided that the electromagnetic field generator also generates a transverse electric field so as to balance (completely or partially) the Lorentz force produced by the magnetic field on the particles.

A holographic mask 1", in particular with a fork-like or spiral-like aperture, is arranged after the first electromagnetic field generator 5. In structural terms, the holographic mask 1" is similar to the vortex beam generator described with reference to the embodiment shown in FIG. 3. Owing to the effect of the holographic mask, the particle beam leaving the electromagnetic field generator 5 is separated diffractively into a central beam and a pair of satellite beams. FIG. 6 shows the diffraction nodes $N_0$, $N_1$ and $N_2$ produced respectively by these beams on an image plane. It can be shown that the central part of the satellite beams $N_1$ and $N_2$ is polarized, with opposing polarization between one beam and the other.

Provision is finally made of a separating apparatus 7" for collecting one of the satellite beams and removing a peripheral portion therefrom, in such a way as to obtain the at least partially spin polarized output particle beam Bo. This can be obtained through the aperture of a condenser arranged after the holographic mask, this aperture being coupled to one of the satellite beams and being dimensioned in such a way as to remove a peripheral fraction therefrom.

Advantageously, this latter architecture could make it possible to achieve simple commutation between the two polarizations, by simply selecting the satellite beam to be taken. Also possible are polarization measures based on the interference between the two satellite beams.

BIBLIOGRAPHIC REFERENCES

[1] O. Darrigol Historical Studies in the Physical Sciences, Vol. 15, No. 1 (1984), pp. 39-79
[2] Y. C. Chao et al., Journal of Physics: Conference Series 299, 012015 (2011)
[3] N. Yamamoto et al., J. Phys.: Conf. Ser. 298, 012017 (2011)
[4] S. McGregor et al., J. Phys. 13, 065018 (2011)
[5] J. Verbeeck et al., Nature 467, 301 (2010)
[6] K. Y. Bliokh et al., Phys. Rev. Lett. 99, 190404 (2007)
[7] H. Rose, Optik 32, 144 (1970)
[8] J. Zach et al., Nucl. Instr. And Meth. A 363, 316 (1995)
[9] M. R. Scheinfein, Optik 82, 99 (1989)
[10] B. J. McMorran et al., Science 331, 192 (2011)
[11] J. Verbeeck et al., Ultramicroscopy (2011), doi: 10.1016/j.ultramic.2011.10.008

The invention claimed is:

1. Apparatus for spin polarizing a particle beam, adapted to process an input particle beam to generate an at least partially spin polarized output particle beam, comprising:
a vortex beam generator for imparting orbital angular momentum to said input particle beam;
an electromagnetic field generator for generating a transverse magnetic field in a space region extending along a segment of a z axis of the input particle beam, in said space region the transverse magnetic field being homogeneous along the direction of the z axis and space-variant in radial and/or azimuthal direction, in such a way as to change the spin of the particles and attach to the particles a plurality of different values of orbital angular momentum in dependence on input spin values; and
a beam component separating unit for spatially separating the particles in dependence on their orbital angular momentum values, to obtain said at least partially spin polarized output particle beam.

2. Apparatus according to claim 1, wherein said transverse magnetic field is rotationally symmetric with respect to the z axis of the input particle beam.

3. Apparatus according to claim 2, wherein said transverse magnetic field is described in cylindrical coordinates by the expression:

$$B(r,\phi,z)=B_0(r)(\cos\alpha(\phi),\sin\alpha(\phi),0),$$

where $B_0(r)$ is a modulus of the magnetic field and the angle $\alpha$ is a function of an azimuthal angle $\phi$:

$$\alpha(r,\phi,z)=q\phi+\beta,$$

where q is a non-zero integer and $\beta$ a constant.

4. Apparatus according to claim 1, wherein said electromagnetic field generator is further adapted to generate a transverse electric field for balancing a Lorentz force exerted on the particles by the magnetic field, said transverse electric field being described by the expression:

$$E(r,\phi,z)=E_0(r)(\sin\alpha(\phi),-\cos\alpha(\phi),0),$$

wherein $E_0(r)$ is the modulus of the electric field, $E_0(r)=B_0(r)p_c/m$, $p_c$ the average beam momentum and m the particle mass, and angle $\alpha$ is a function of the azimuthal angle $\phi$:

$$\alpha(r,\phi,z)=q\phi+\beta,$$

where q is a non-zero integer and $\beta$ a constant.

5. Apparatus according to claim 1, further comprising an auxiliary electromagnetic field generator arranged after said electromagnetic field generator, said auxiliary electromagnetic field generator being adapted to generate a transverse magnetic field in a second space region extending along a second segment of the z axis of the input particle beam, in said second space region the transverse magnetic field being equal in magnitude, but opposite in sign, to the transverse magnetic field generated by the electromagnetic field generator.

6. Apparatus for spin polarizing a particle beam, adapted to process an input particle beam to generate an at least partially spin polarized output particle beam, comprising:
an electromagnetic field generator for generating a transverse magnetic field in a space region extending along a segment of a z axis of the input particle beam, in said space region the transverse magnetic field being homogeneous along the direction of the z axis and space-variant in radial and/or azimuthal direction, to change spin of the particles and attach to the particles a plurality of different values of orbital angular momentum in dependence on their input spin values;
a holographic mask for diffractively separating the particle beam into a central beam and a pair of satellite beams, and
a separating unit for collecting at least one of the satellite beams and removing a peripheral portion therefrom, to obtain the at least partially spin polarized output particle beam.

7. A method for spin polarizing a particle beam, comprising the following steps:
providing an input particle beam;
imparting an orbital angular momentum to said input particle beam;
in a space region extending along a segment of a z axis of the input particle beam, subjecting said input particle beam to a transverse magnetic field being homogeneous along a direction of the z axis and space-variant in radial and/or azimuthal direction, in such a way to change spin of the particles and attach to the particles a plurality of different values of orbital angular momentum in dependence on input spin values; and
spatially separating the particles in dependence on orbital angular momentum values, to obtain an at least partially spin polarized output particle beam.

8. A method according to claim 7, wherein said transverse magnetic field is rotationally symmetric with respect to the z axis of the input particle beam.

9. A method according to claim 8, wherein said transverse magnetic field is described by the expression $$B(r,\phi,z)=B_0(r)(\cos\alpha(\phi),\sin\alpha(\phi),0),$$

where $B_0(r)$ is a modulus of the magnetic field and the angle $\alpha$ is a function of the azimuthal angle $\phi$:

$$\alpha(r,\phi,z)=q\phi+\beta,$$

where q is a non-zero integer and $\beta$ a constant.

10. A method according to claim 9, wherein in said space region the input particle beam is further subjected to a transverse electric field for balancing a Lorentz force exerted on the particles by the magnetic field, said transverse electric field being described by the expression $$E(r,\phi,z)=E_0(r)(\sin\alpha(\phi),-\cos\alpha(\phi),0),$$

wherein $E_0(r)$ is a modulus of the electric field, $E_0(r)=B_0(r)\, p_c/m$, $p_c$ the average beam momentum and m the particle mass, and the angle $\alpha$ is a function of azimuthal angle $\phi$:

$$\alpha(r,\phi,z)=q\phi+\beta,$$

where q is a non-zero integer and $\beta$ a constant.

11. A method for spin polarizing a particle beam, comprising the following steps:
providing an input particle beam;
in a space region extending along a segment of a z axis of the input particle beam, subjecting said input particle beam to a transverse magnetic field being homogeneous along a direction of the z axis and space-variant in radial and/or azimuthal direction, to change a spin of the particles and attach to the particles a plurality of different values of orbital angular momentum in dependence on input spin values;
diffractively separating the particle beam into a central beam and a pair of satellite beams, and
collecting at least one of the satellite beams and removing a peripheral portion therefrom, to obtain the at least partially spin polarized output particle beam.

12. A method for producing a vortex particle beam, comprising the following steps:
providing a spin polarized input particle beam; and
in a space region extending along a segment of a z axis of the input particle beam, subjecting said input particle beam to a transverse magnetic field being homogeneous along a direction of the z axis and space-variant in radial and/or azimuthal direction, to impart to said particle beam an orbital angular momentum in dependence on particle spin.

* * * * *